(12) United States Patent
Raghuram

(10) Patent No.: US 7,200,021 B2
(45) Date of Patent: Apr. 3, 2007

(54) STACKED DRAM MEMORY CHIP FOR A DUAL INLINE MEMORY MODULE (DIMM)

(75) Inventor: Siva Raghuram, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/010,942

(22) Filed: Dec. 10, 2004

(65) Prior Publication Data

US 2006/0126369 A1    Jun. 15, 2006

(51) Int. Cl.
*G11C 5/02* (2006.01)
(52) U.S. Cl. .......................... 365/51; 711/686
(58) Field of Classification Search ............... 365/51; 257/686
See application file for complete search history.

(56) References Cited

U.S. PATENT DOCUMENTS 6,683,372 B1 * 1/2004 Wong et al. ................. 257/686

2002/0112119 A1 * 8/2002 Halbert et al. .............. 711/115

* cited by examiner

*Primary Examiner*—Huan Hoang
*Assistant Examiner*—Kretelia Graham
(74) *Attorney, Agent, or Firm*—Jenkins, Wilson, Taylor & Hunt, P.A.

(57) ABSTRACT

A stacked DRAM memory chip for a Dual In Line Memory Module (DIMM) is disclosed. According to one aspect, the DRAM memory chip comprises at least four stacked DRAM memory dies. Further, the memory dies are each selectable by a corresponding internal memory rank signal. Each memory die comprises an array of memory cells. A common internal address bus is provided for addressing the memory cells and is connected to all stacked DRAM memory dies. Internal data buses are provided for writing data into the memory cells and reading data out of the memory cells of the DRAM memory dies. An integrated redriving unit comprises buffers for all internal address lines provided for driving external address signals applied to address pads of the DRAM memory chip. A multiplexer/demultiplexer switches the internal data lines of the selected DRAM memory die. A memory rank decoder selects a corresponding memory die.

11 Claims, 4 Drawing Sheets

STACKED DRAM MEMORY CHIP FOR A DUAL INLINE MEMORY MODULE (DIMM)

TECHNICAL FIELD

The invention relates in general to a DRAM chip for a DRAM Dual Inline Memory Module (DIMM) and in particular to a DRAM memory chip for a registered Dual Inline Memory Module (DIMM).

BACKGROUND ART

Memory modules are provided for increasing the memory capacity of a computer system. Originally single inline memory modules (SIMM) were used in personal computers to increase the memory size. A single inline memory module comprises DRAM chips on its printed circuit board (PCB) only on one side. The contacts for connecting the printed circuit board of the single inline memory module (SIMM) are redundant on both sides of the module. A first variant of SIMMs has thirty pins and provides 8 bits of data (9 bits in parity versions). A second variant of SIMMs which are called PS/2 comprise 72 pins and provide 32 bits of data (36 bits in parity versions).

Due to the different data bus width of the memory module in some processors, sometimes several SIMM modules are installed in pairs to fill a memory bank. For instance, in 80386 or 80486 systems having a data bus width of 32 bits either four 30 pins SIMMs or one 72 pin SIMM are required for one memory bank. For pentium systems having a data bus width of 64 bits two 72 pin SIMMs are required. To install a single inline memory module (SIMM) the module is placed in a socket. The RAM technologies used by single inline memory modules include EDO and FPM.

Dual Inline Memory Modules (DIMM) began to replace single inline memory modules (SIMM) as the predominant type of memory modules when Intels pentium processors became wide spread on the market.

While single inline memory modules (SIMMS) have memory units or DRAM chips mounted only on one side of their printed circuit boards (PCB) a dual inline memory modules (DIMMS) comprise memory units mounted on both sides of the printed circuit board of the modules.

There are different types of Dual Inline Memory Modules (DIMM). An unbuffered Dual Inline Memory Module does not contain buffers or registers located on the module. These unbuffered Dual Inline Memory Modules are typically used in desktop PC systems and workstations. The number of pins are typically 168 in single data rate (SDR) memory modules, 184 pins in double data rate modules and in DDR-2 modules. DDR-2-DRAMs are a natural extension of the existing DDR-DRAMs. DDR-2 has been introduced at an operation frequency of 200 MHz and is going to be extended to 266 MHz (DDR-2 533), 333 MHz (DDR-2 667) for the main memory and even 400 MHz (DDR-2 800) for special applications. DDR-SDRAM (synchronous DRAMs) increase speed by reading data on both the rising edge and the falling edge of a clock pulse, essentially doubling the data bandwidth without increasing the clock frequency of a clock signal.

A further type of Dual Inline Memory Module (DIMM) is a registered Dual Inline Memory Module. A registered Dual Inline Memory Module comprises several additional circuits on the module in particular a redriver buffer component like a register to redrive command address signals. Further, a phase locked loop (PLL) is provided for timing alignments to redrive clock signals. Registered Dual Inline Memory Modules are typically used in highend servers and highend workstations.

ECC-Dual Inline Memory Modules comprise error correction bits or ECC bits. This type of Dual Inline Memory Module has a total of 64 data bits plus 8 ECC bits and is used mostly for server computers. Registered Dual Inline Memory Modules either with ECC or without ECC are used for SDR, DDR and DDR-2.

A further type of Dual Inline Memory Modules are so called small outline DIMM (SO-DIMM). They are an enhanced version of standard Dual Inline Memory Modules and are used in laptops and in some special servers.

A Dual Inline Memory Module comprises a predetermined number N of memory chips (DRAMs) on its printed circuit board. The data width of each memory chip is typically 4 bits, 8 bits or 16 bits. Nowadays personal computer mostly uses a unbuffered Dual Inline Memory Module if a DIMM is selected as the main memory. However, for a computer system with higher main memory volume requirements, in particular a server, registered Dual Inline Memory Modules are the popular choice.

Since memory requirements in a computer system are increasing day by day i.e. both in terms of memory size and memory speed it is desired to place a maximum number of memory chips (DRAMs) on each memory module (DIMM).

FIG. 1 shows a Dual Inline Memory Module according to the state of the art. The Dual Inline Memory Module comprises N DRAM chips mounted on the upper side of the printed circuit board (PCB). The registered Dual Inline Memory Module as shown in FIG. 1 comprises a command and address buffer which buffers command and address signals applied to the Dual Inline Memory Module by a main motherboard and which outputs these signals via a command and address bus (CA) to the DRAM chips mounted on the printed circuit board. A chip selection signal S is also buffered for selecting the desired DRAM chip mounted on the DIMM circuit board. All DRAM chips are clocked by a clock signal $CLK'\_$ which is buffered by a clock signal buffer which is also mounted on the Dual Inline Memory Module (DIMM). Each DRAM chip is connected to the motherboard by a separate databus (DQ) having q data lines. The data bus of each DRAM chip comprises typically 4 to 16 bits.

FIG. 2 shows a cross section of the Dual Inline Memory Module (DIMM) as shown in FIG. 1 along the line A–A'. To increase the memory capacity the DIMM has DRAM chips mounted on both sides of the printed circuit board (PCB). There is a DRAM chip on the top side of the DIMM module and a DRAM chip on the bottom side of the DIMM module. Accordingly the DRAM Dual Inline Memory Module as shown in FIG. 2 comprises two memory ranks or memory levels, i.e. memory rank 0 and memory rank 1.

To increase the memory capacity of a Dual Inline Memory Module (DIMM) further stacked DRAM chips have been developed.

FIG. 3 shows a stacked DRAM chip having an upper memory die and a lower memory die thus providing two memory ranks within one stacked DRAM chip. The two memory dies are packaged within one chip on a substrate. The stacked DRAM chip is connected to the printed circuit board via pads such as solder balls. Dual Inline Memory Modules which have stacked DRAM chips as shown in FIG. 3 on both sides of the printed circuit board have four memory ranks, i.e. two memory ranks on the top side and two memory ranks on the bottom side.

In current computer Dual Inline Memory Modules having two memory ranks are allowed. When increasing the number of memory ranks within the memory systems to four memory ranks or even eight memory ranks the load on the DQ bus and the CA bus as shown in FIG. 1 is increased. For the CA bus the increase of load is not dramatically since the command and address bus (CA) is running at half speed in comparison to the data bus and the command and address buffer redrives the address and command signals applied by the processor on the motherboard to the Dual Inline Memory Module. The increase of memory ranks on the Dual Inline Memory Module however causes an increase of the load of the DQ-data bus which is driven by the controller on the motherboard. The data rate on the DQ-busses is very high in particular when running at DDR-2 data rate. Consequently an increase of the load connected to each DQ data bus deteriorates rates the data signals further so that data errors can not be excluded. Accordingly there is a limitation of the number M of memory ranks within a DRAM chip connected to the DQ-bus of said chip. By limiting the number of memory ranks allowed within a DRAM chip the memory capacity of a Dual Inline Memory is also limited.

SUMMARY OF THE INVENTION

Accordingly it is the object of the present invention to provide a stacked DRAM memory chip for a Dual Inline Memory Module allowing for a predetermined operation frequency an increased number of memory ranks on the Dual Inline Memory Module.

This object is achieved by a stacked DRAM memory chip having the features of claim 1.

The present invention provides a stacked DRAM memory chip for a Dual Inline Memory Module (DIMM) having (a) a predetermined number (M) of stacked DRAM memory dies;

(b) wherein each DRAM memory die is selectable by a corresponding memory rank signal (r);

(c) wherein each DRAM memory die comprises an array of memory cells;

(d) wherein a common internal address bus consisting of address lines is provided for addressing the memory cells and is connected to all M stacked DRAM memory dies;

(e) wherein M internal data buses consisting of internal data lines are provided for writing data into the memory cells and reading data out of the memory cells of the stacked DRAM memory dies;

wherein (f) an integrated redriving unit is provided which comprises:

(f1) buffers for all internal address lines provided for driving external address signals applied to address pads of said DRAM memory chip and;

(f2) a multiplexer/demultiplexer which switches the internal data lines of the selected DRAM memory die to data pads of said DRAM memory chip.

In a preferred memory chip the redriving unit further comprises a memory rank decoder for generating the internal memory rank signal in response to external select signals applied to control pads of the DRAM memory chip.

This has the advantage that by integrating the memory rank decoder within the DRAM memory chip the number of selection signals which have to be supplied by the command and address buffer to each DRAM chip is reduced. Consequently the number of selection signal lines on the Dual Inline Memory Module is reduced so that the size of the printed circuit board is decreased and the complexity of the line routing is diminished.

In a further embodiment the memory rank decoder controls the multiplexer/demultiplexer.

In a further embodiment the multiplexer/demultiplexer comprises buffers for buffering the data signals transmitted via the switched data lines.

In a preferred embodiment of the stacked DRAM memory chip according to the present invention all DRAM memory dies are clocked by a common internal clock signal.

In a preferred embodiment of the stacked DRAM chip according to the present invention the redriving unit further comprises a buffer for driving an external clock signal applied to a clock pad of the DRAM memory chip to generate said internal clock signal.

In a preferred embodiment of the stacked DRAM memory chip according to the present invention the stack of DRAM dies and the redriving unit are integrated in the DRAM memory chip.

In a preferred embodiment of the DRAM memory chip according to the present invention the redriving unit is powered via power supply pads of said DRAM memory chip.

The invention further provides a Dual Inline Memory Module comprising a plurality of stacked DRAM memory chips, wherein each stacked DRAM memory chip has (a) a predetermined number (M) of stacked DRAM memory dies;

(b) wherein each DRAM memory die is selectable by a corresponding memory rank signal (r);

(c) wherein each DRAM memory die comprises an array of memory cells;

(d) wherein a common internal address bus consisting of address lines is provided for addressing the memory cells and is connected to all M stacked DRAM memory dies;

(e) wherein M internal data buses consisting of internal data lines are provided for writing data into the memory cells and reading data out of the memory cells of the stacked DRAM memory dies;

(f) wherein beneath the stacked DRAM-memory dies a redriving unit is provided, wherein the redriving unit comprises:

(f1) buffers for all internal address lines provided for driving external address signals applied to address pads of said DRAM memory chip and;

(f2) a multiplexer/demultiplexer which switches the internal data lines of the selected DRAM memory die to data pads of said DRAM memory chip.

In a preferred embodiment the Dual Inline Memory Module comprises a command and address buffer chip for buffering command and address signals received from the main printed circuit board.

In a preferred embodiment of the Dual Inline Memory Module according to the present invention the command and address buffer is connected via a command and address bus to all stacked DRAM memory chips mounted on a printed circuit board of said Dual Inline Memory Module.

DETAILED DESCRIPTION OF THE INVENTION

Figure 1:
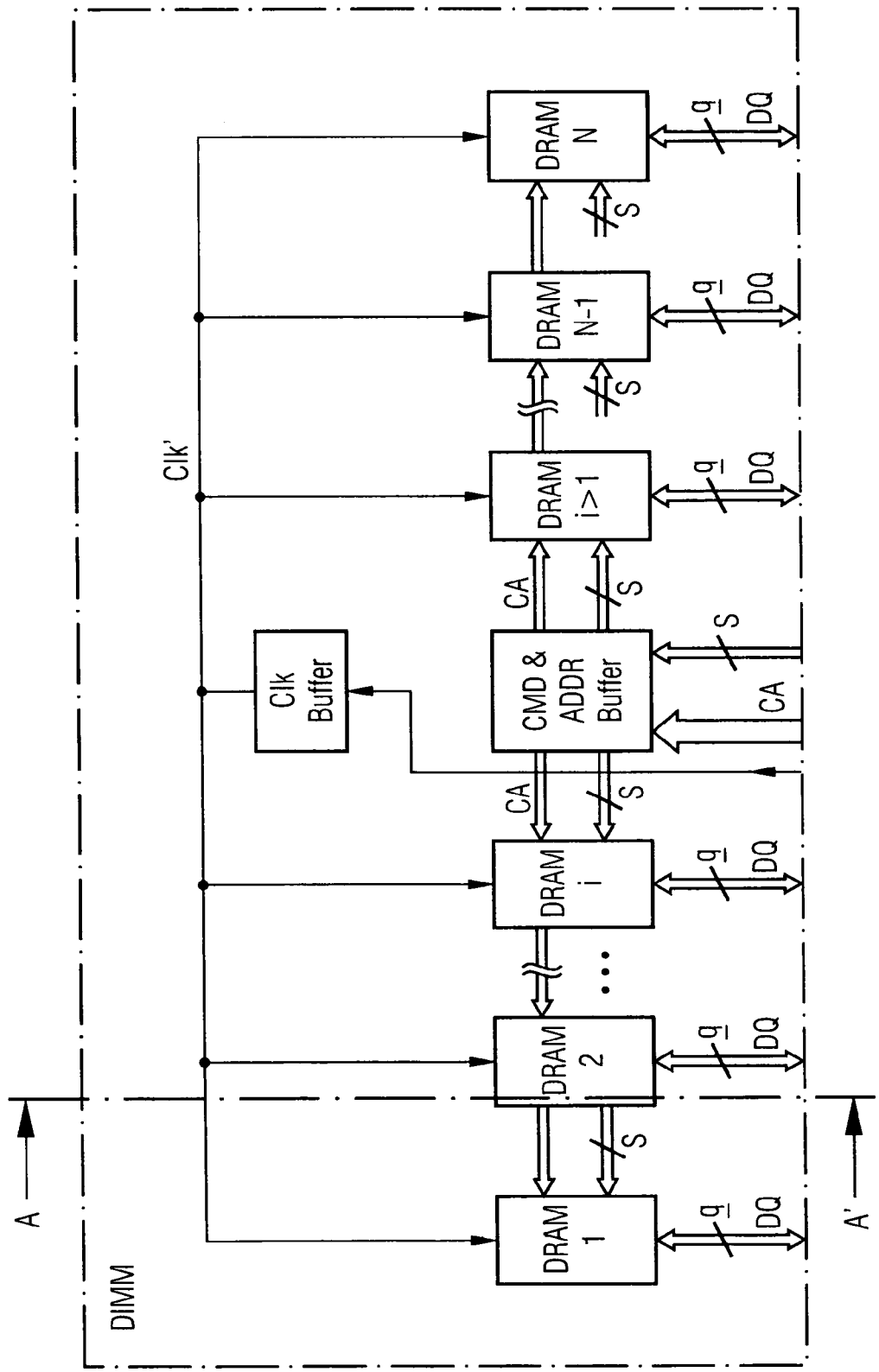
FIG. 1 shows a Dual Inline Memory Module (DIMM) according to the state of the art from above.
Figure 2:
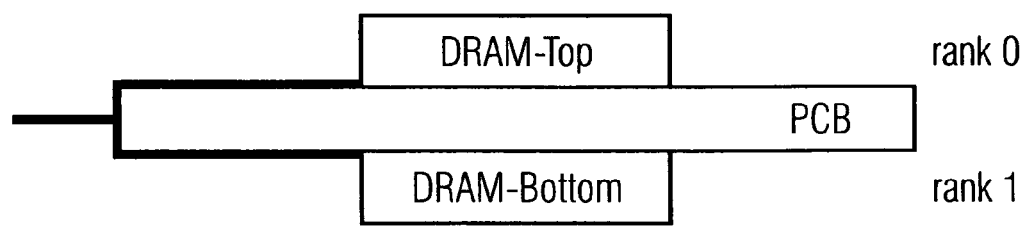
FIG. 2 is a cross section view of the Dual Inline Memory Module according to the state of the art as shown in FIG. 1.
Figure 3:
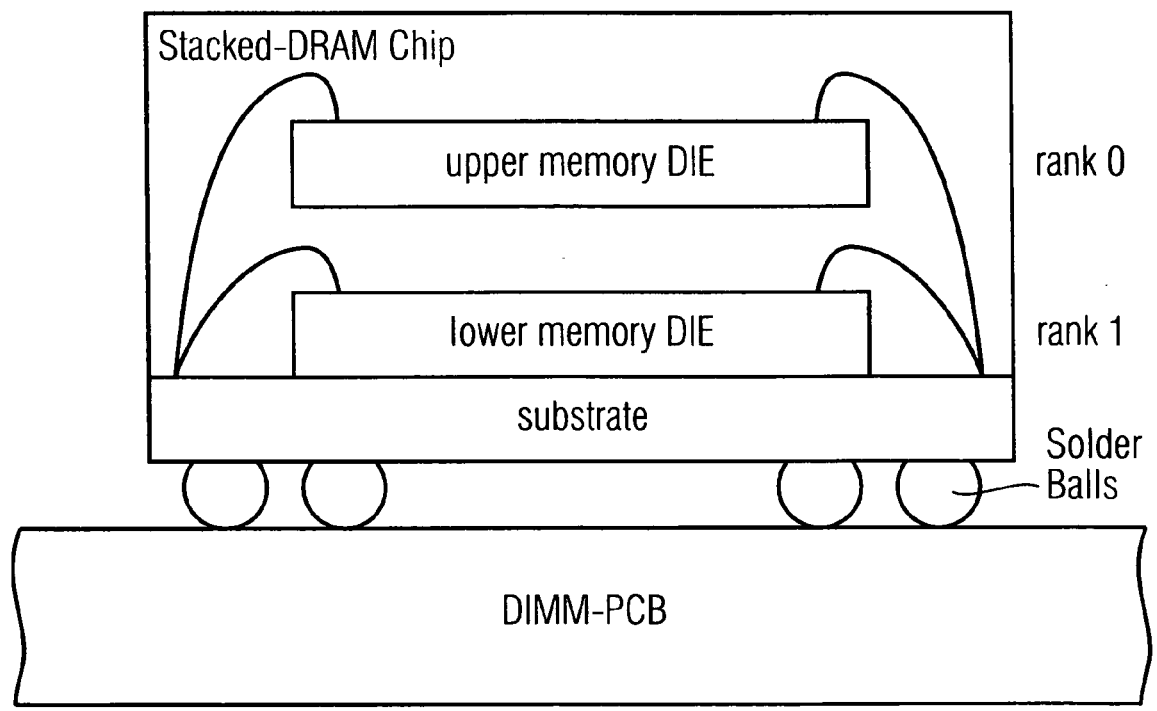
FIG. 3 shows a cross section of a stacked DRAM chip according to the state of the art.
Figure 4:
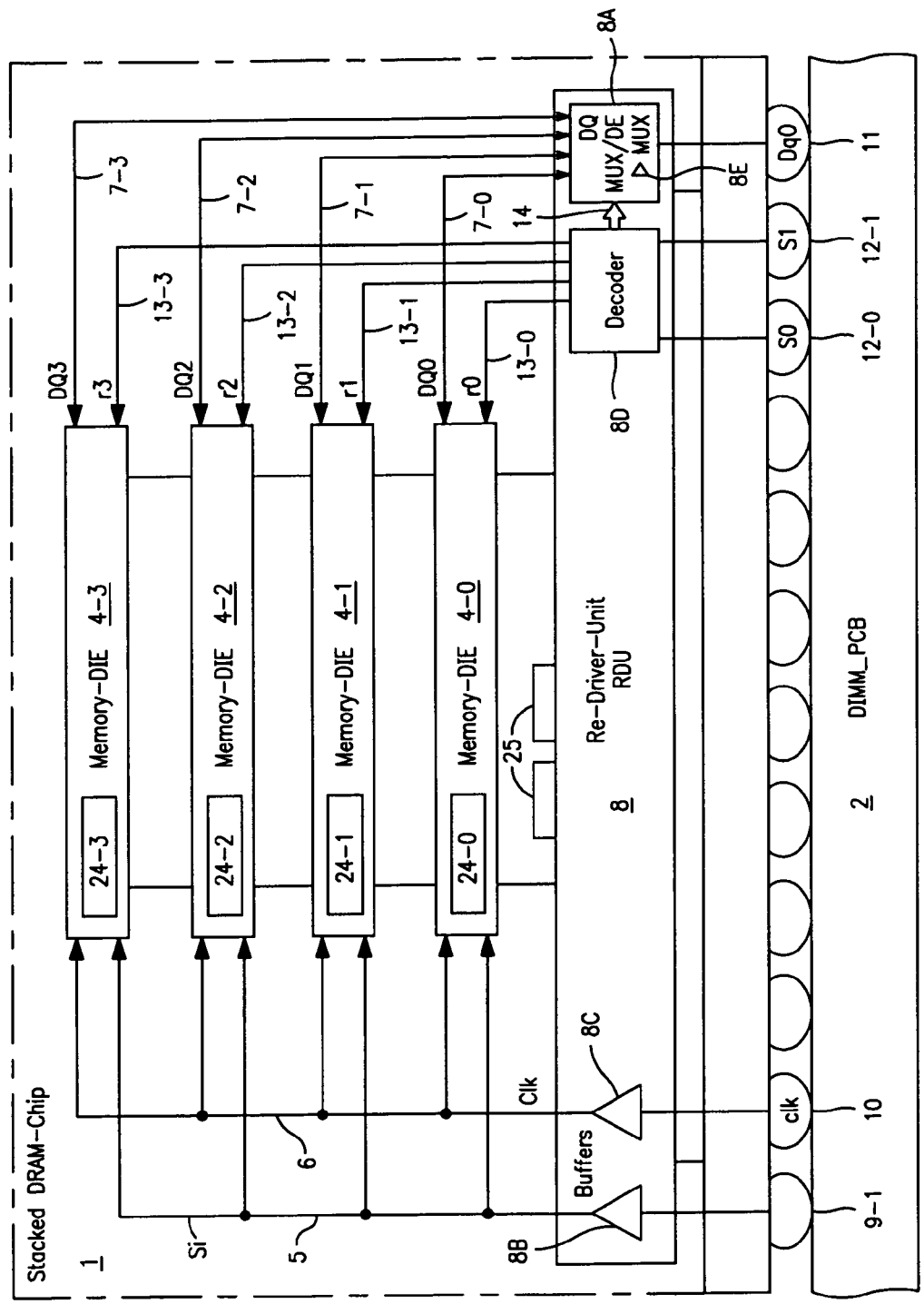
FIG. 4 shows a cross section view of a preferred embodiment of a stacked DRAM chip according to the present invention.
Figure 5:
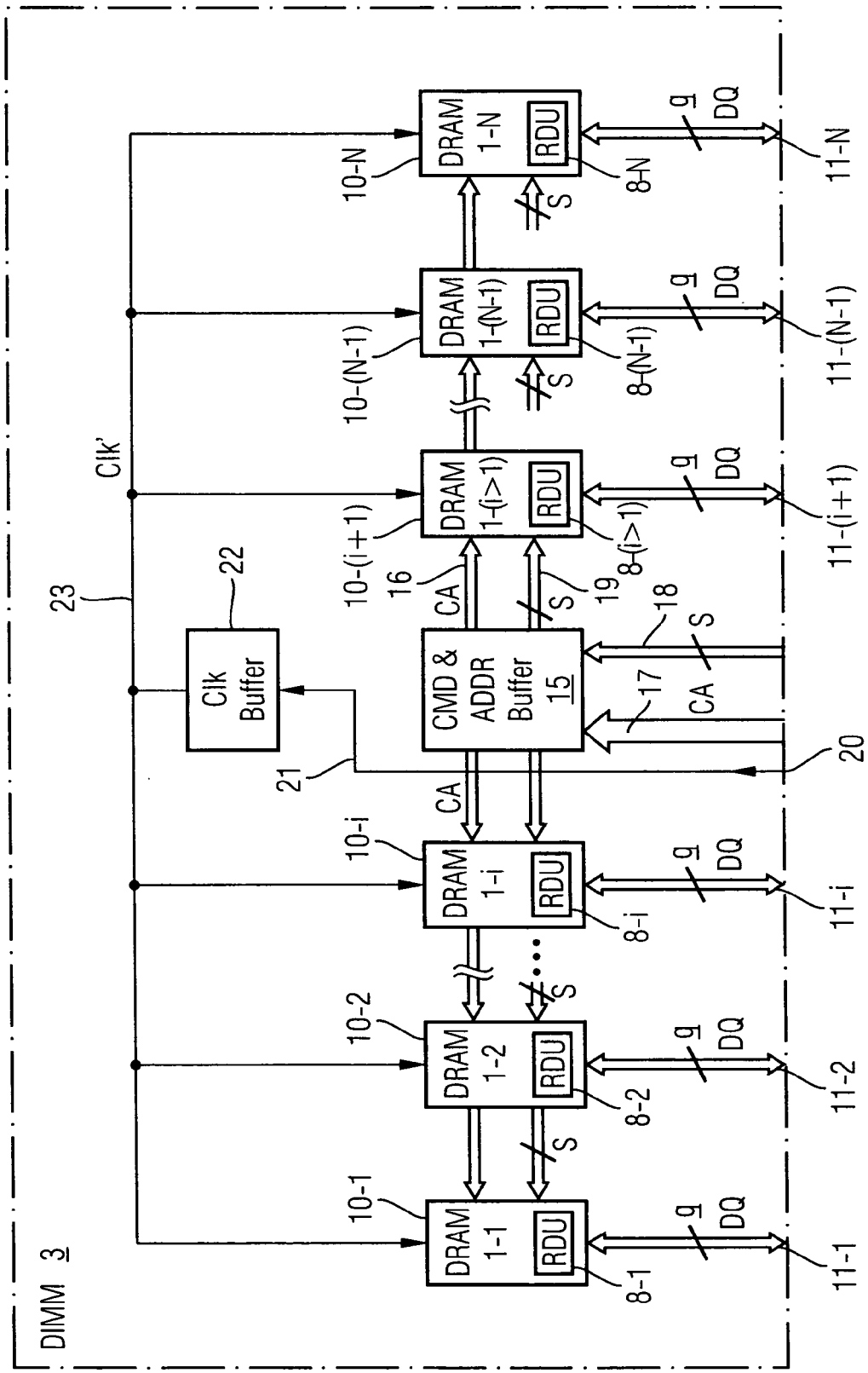
FIG. 5 shows a top view of a Dual Inline Memory Module comprising stacked DRAM chips according to the present invention.

Referring to FIG. 4 it shows a cross section of a stacked DRAM memory chip 1 mounted on a printed circuit board (PCB) 2 of a Dual Inline Memory Module 3 (shown in FIG. 5). The stacked DRAM chip I as shown in FIG. 4 comprises in the shown embodiment four stacked DRAM memory dies 4-0, 4-1, 4-2, 4-3. Each memory die 4-$i$ is selectable by a corresponding memory rank signal r–i. The DRAM memory dies 4-$i$ include an array of memory cells (designated 24-0. 24-1. 24-2. and 24-3) which are addressable by address lines. A common internal address bus 5 comprises a predetermined number of internal address lines 5-$i$ provided for addressing memory cells 24-$i$ of the memory dies 4-$i$. FIG. 4 shows as an example an address pad $A_0$ connected via an address line 5-$i$ to all memory dies 4-$i$. All address lines of the internal address bus are connected in parallel to all four DRAM memory dies of the stacked DRAM chip 1. The memory dies 4-$i$ are clocked by a clock signal CLK applied to all memory dies via an internal clock line 6 as shown in FIG. 4. Each memory die 4-$i$ is connected via a corresponding internal data bus 7-$i$ to a DQ multiplexer/demultiplexer BA. Each internal data bus 7-$i$ comprises a predetermined number of data lines (i.e., 7-0. 7-1, 7-2. and 7-3) for connecting the respective memory die 4-$i$ to the DQ-multiplexer/demultiplexer BA. Each DQ-data bus 7-$i$ comprises for instance 4 to 16 bit lines. The internal data busses DQ-busses 7-$i$ are provided for writing data into the memory cells and for reading data out of memory cells 24-$i$ of the stacked DRAM memory dies 4-$i$.

The stacked DRAM chip 1 according to the present invention as shown in FIG. 4 comprises beneath the stacked DRAM memory dies 4-$i$ a redriving unit 8. The redriving unit 8 comprises the DQ-multiplexer/demultiplexer unit 8A and buffers 8B for all internal address lines 5-$i$ provided for driving external address signals applied to address pads 9-$i$ of said DRAM memory chip 1. In the preferred embodiment as shown in FIG. 4 the redriving unit 8 further comprises a buffer 8C for driving a clock signal CLK applied to the DRAM chip 1 by means of a clock signal pad 10. The redriving unit 8 comprises in all embodiments the multiplexer/demultiplexer 8A which switches the internal data lines or data bus 7-$i$ of a selected DRAM memory die to data pads 11 of the DRAM memory chip 1. Pads 9,10, 11 are formed by balls or pins. The number q of DQ lines per DRAM chip I is in a preferred embodiment either four or eight. Redriving unit 8 is power by power supply pads 25 of DRAM memory chip 1.

In the preferred embodiment as shown in FIG. 4 the redriving unit 8 further comprises a memory rank decoder 8D for generating internal memory rank selection signals r–i in response to external select signals $S_i$ applied to control pads 12-0, 12-1 of the DRAM memory chip 1 as shown in FIG. 4. The memory rank decoder 8D receives in the shown embodiment two external selection signals $S_0$, $S_1$ and decodes them to generate four memory rank signals $r_i$ which are applied to the memory dies 4-$i$ via control lines 13-$i$.

In the preferred embodiment of FIG. 4 the memory rank decoder 8D is integrated within the redriving unit 8 of the stacked DRAM 1. In an alternative embodiment the decoder 8D is integrated in central command and address buffer of the Dual Inline Memory Module 3. Integration of the memory rank decoder 8D within the redriving unit 8 has the advantage that the number of selection signals and selection lines on the Dual Inline Memory Module 3 can be minimized. In the preferred embodiment of FIG. 4 the memory rank decoder 8D controls the DQ-multiplexer/demultiplexer 8A via internal control lines 14. The multiplexer/demultiplexer 8A comprises in a preferred embodiment buffers 8E for driving the data signals transmitted via the switched data lines. The multiplexer/demultiplexer 8A is switched from the multiplexing mode (read mode) to the demultiplexing mode (write mode) in response to a write Enable (WE) control signal.

The stack of DRAM memory dies 4-$i$ and the redriving unit 8 are integrated in the DRAM memory chip 1. To increase the memory density per Dual Inline Memory Module 3 the memory dies are integrated in a preferred embodiment into a FBGA (fine pitch ball grid). The provision of a redriving unit 8 within the stacked DRAM chip 1 which might be integrated in the FBGA package allows to increase the number of memory dies 4-$i$ without increasing the load for the command and address buffer 15 and more importantly the load for the processor on the main board. This allows a significantly higher operation frequency for operating the Dual Inline Memory Module 3. In the preferred embodiment as shown in FIG. 4 the redriving unit 8 is provided beneath the memory die stack on the bottom side of the stacked DRAM chip 1.

FIG. 5 shows a Dual Inline Memory Module 3 comprising a predetermined number N of stacked DRAM chips I as shown in FIG. 4. The number N of DRAMs is typically 9 or 18 depending on the number M of memory ranks. Each stacked DRAM chip I comprises M stacked DRAM memory dies. The number M of stacked DRAM memory dies may be 1, 2, 4, 8,16 . . . DRAM memory dies. The Dual Inline Memory Module 3 further comprises at least one central command and address buffer 15 which is located in the middle of the printed circuit board 2 (shown in FIG. 4) of the Dual Inline Memory Module 3. The command and address buffer 15 is connected via a command and address bus 16 to all DRAM memory chips 1 on the Dual Inline Memory Module 3. The command and address buffer 15 receives command and address signals from the main circuit board via command and address lines 17 and drives them via the command and address bus 16 to all DRAM chips 1. The command and address buffer 15 further receives selection signals via a selection control bus 18 and drives them via a selection signal bus 19 to all DRAM chips 1. The selection signals applied to the DRAM chips 1 via the selection bus 19 selects the DRAM chip and the memory die 4-$i$ within the DRAM chip 1.

In case that the local memory rank decoder 8D is integrated within the redriving unit 8 of each stacked DRAM memory chip 1 the bus width S of the selection signal bus 19 is given by:

$$2^S = N+M$$

wherein N is the number of DRAM chips on the Dual Inline Memory Module 3 and

M is the number of stacked memory dies or ranks within each DRAM chip 1.

In an embodiment where the memory rank decoder 8D is integrated in the command and address buffer 15 and not within the DRAM chips 1 the bus width S of the selection control bus 19 is given by $$S = 1dN + M$$

In both embodiments the number of contact pads to contact the Dual Inline Memory Module 3 to the motherboard via selection lines 18 is minimized.

The Dual Inline Memory Module 3 according to the present invention as shown in FIG. 5 further comprises at least one contact pad 20 which is connected via a clock line 21 to a clock signal buffer 22. The external clock signal received from the motherboard is buffered by the clock signal buffer 21 and applied to all DRAM memory chips 1 via an internal clock line 23. Each DRAM chip 1 comprises a redriving unit 8 with a buffer 8C (shown in FIG. 4) for buffering the received internal clock signal.

With the stacked DRAM memory chip 1 according to the present invention a multi rank Dual Inline Memory Module 3 can be achieved with a very high memory density without increasing the load for the processor on the motherboard. Accordingly the Dual Inline Memory Module 3 comprising the stacked DRAM memory chips 1 according to the present invention allows higher operation frequencies of the processor. The stacking of the memory dies provides unprecedented memory density per board area and offers at the same time superior electrical properties of the resulting dual inline memory component. A Dual Inline Memory Module 3 according to the present invention is fully compatible with existing slots for Dual Inline Memories. Since the same interconnection technology is used for the stacked memory dies 4-1 these dies have similar electrical parameters. In a preferred embodiment the DRAM memory chips 1 are integrated in fine pitched ball grid packages (FPBG) in BOC board on chip technology.

What is claimed is:

1. A stacked DRAM Memory Chip for a Dual In Line Memory Module comprising:
    (a) a predetermined number of at least four stacked DRAM memory dies;
    (b) wherein the stacked DRAM memory dies are each selectable by a corresponding internal memory rank signal;
    (c) wherein each DRAM memory die comprises an array of memory cells;
    (d) wherein a common internal address bus consisting of internal address lines is provided for addressing the memory cells and is connected to all stacked DRAM memory dies;
    (e) wherein internal data buses consisting of internal data lines are provided for writing data into the memory cells and reading data out of the memory cells of the stacked DRAM memory dies; wherein
    (f) an integrated redriving unit is provided which comprises:
        (f1) buffers for all internal address lines provided for driving external address signals applied to address pads of said stacked DRAM memory chip;
        (f2) a multiplexer/demultiplexer which switches the internal data lines of the selected DRAM memory die to data pads of said stacked DRAM memory chip; and
        (f3) a memory rank decoder for generating the internal memory rank signal to select a corresponding stacked DRAM memory die in response to external select signals applied to control pads of the stacked DRAM memory chip via an external selection signal bus, wherein a bus width S of the external selection signal bus depends on a number N of DRAM memory chips on the Dual In Line Memory Module and the predetermined number M of stacked DRAM memory dies within the DRAM memory chip as follows: $2^S = N + M$.

2. The stacked DRAM Memory Chip according to claim 1, wherein the memory rank decoder controls the multiplexer/demultiplexer.

3. The stacked DRAM memory chip according to claim 1, wherein the multiplexer/demultiplexer is switched between a multiplexing mode and a demultiplexing mode in response to a Write Enable control signal.

4. The stacked DRAM Memory Chip according to claim 1, wherein the multiplexer/demultiplexer comprises buffers for driving data signals transmitted via the switched internal data lines.

5. The stacked DRAM Memory Chip according to claim 1, wherein all stacked DRAM memory dies are clocked by a common internal clock signal.

6. The stacked DRAM Memory Chip according to claim 5, wherein the integrated redriving unit further comprises a buffer for driving an external clock signal applied to a clock pad of the stacked DRAM memory chip to generate said common internal clock signal.

7. The stacked DRAM Memory Chip according to claim 1, wherein the stacked DRAM memory dies and the integrated redriving unit are integrated in the stacked DRAM memory chip.

8. The stacked DRAM Memory Chip according to claim 1, wherein the integrated redriving unit is powered via power supply pads of said stacked DRAM memory chip.

9. A Dual In Line Memory Module comprising a plurality of stacked DRAM memory chips, wherein each stacked DRAM memory chip comprises:
    (a) a predetermined number of at least four stacked DRAM memory dies;
    (b) wherein the stacked DRAM memory dies are each selectable by a corresponding internal memory rank signal;
    (c) wherein each DRAM memory die comprises an array of memory cells;
    (d) wherein a common internal address bus consisting of internal address lines is provided for addressing the memory cells and is connected to all stacked DRAM memory dies;
    (e) wherein internal data buses consisting of internal data lines are provided for writing data into the memory cells and reading data out of the memory cells of the stacked DRAM memory dies;
    (f) wherein an integrated redriving unit is provided which comprises:
        (f1) buffers for all internal address lines provided for driving external address signals applied to address pads of said stacked DRAM memory chip;
        (f2) a multiplexer/demultiplexer which switches the internal data lines of the selected stacked DRAM memory die to data pads of said stacked DRAM memory chip; and
        (f3) a memory rank decoder for generating the internal memory rank signal to select a corresponding stacked DRAM memory die in response to external select signals applied to control pads of the stacked DRAM memory chip via an external selection signal bus, wherein a bus width S of the external selection signal bus depends on a number N of DRAM memory chips on the Dual In Line Memory Module and the predetermined number M of stacked DRAM memory dies within said DRAM memory chip as follows: $2^S=N+M$.

10. The Dual In Line Memory Module according to claim 9, wherein the Dual In Line Memory Module further comprises a command and address buffer chip for buffering command and address signals received from a main printed circuit board.

11. The Dual In Line Memory Module according to claim 10, wherein the command and address buffer is connected via a command and address bus and the external rank selection signal bus to all stacked DRAM memory chips mounted on a printed circuit board of said Dual In Line Memory Module.

* * * * *